United States Patent
Yang et al.

(10) Patent No.: US 8,396,183 B2
(45) Date of Patent: Mar. 12, 2013

(54) SHIFT REGISTER CIRCUIT

(75) Inventors: Yu-Chung Yang, Hsin-Chu (TW);
Yung-Chih Chen, Hsin-Chu (TW);
Kuo-Hua Hsu, Hsin-Chu (TW);
Kuo-Chang Su, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 89 days.

(21) Appl. No.: 13/049,863

(22) Filed: Mar. 16, 2011

(65) Prior Publication Data
US 2012/0140871 A1 Jun. 7, 2012

(30) Foreign Application Priority Data
Dec. 6, 2010 (TW) .............................. 99142403 A (51) Int. Cl.
*G11C 19/00* (2006.01)

(52) U.S. Cl. ................................ 377/64; 377/68; 377/79

(58) Field of Classification Search .......................... None
See application file for complete search history.

(56) References Cited

U.S. PATENT DOCUMENTS

| | | | | |
|---|---|---|---|---|
| 7,317,780 B2* | 1/2008 | Lin et al. | ........................ | 377/67 |
| 7,342,568 B2* | 3/2008 | Wei et al. | ........................ | 345/100 |
| 7,400,698 B2* | 7/2008 | Chang et al. | ........................ | 377/64 |
| 7,450,681 B2* | 11/2008 | Wei et al. | ........................ | 377/64 |
| 7,627,077 B2* | 12/2009 | Wei et al. | ........................ | 377/64 |
| 7,688,934 B2* | 3/2010 | Tsai et al. | ........................ | 377/64 |
| 7,738,623 B2* | 6/2010 | Tobita | ........................ | 377/64 |
| 7,953,201 B2* | 5/2011 | Tsai et al. | ........................ | 377/64 |
| 8,175,215 B2* | 5/2012 | Liu et al. | ........................ | 377/64 |
| 2006/0170641 A1 | 8/2006 | Song | | |
| 2007/0086558 A1* | 4/2007 | Wei et al. | ........................ | 377/64 |
| 2007/0159438 A1 | 7/2007 | Cho | | |
| 2007/0192659 A1* | 8/2007 | Kang et al. | ........................ | 714/726 |
| 2008/0012816 A1* | 1/2008 | Moon | ........................ | 345/100 |
| 2011/0044423 A1* | 2/2011 | Lin et al. | ........................ | 377/64 |
| 2011/0069806 A1* | 3/2011 | Liao et al. | ........................ | 377/64 |
| 2012/0155604 A1* | 6/2012 | Yang et al. | ........................ | 377/79 |
| 2012/0169581 A1* | 7/2012 | Su et al. | ........................ | 345/100 |

\* cited by examiner

*Primary Examiner* — Tuan T Lam
(74) *Attorney, Agent, or Firm* — Winston Hsu; Scott Margo (57) ABSTRACT

A shift register circuit includes plural shift register stages for providing plural gate signals. Each shift register stage includes an input unit, a pull-up unit, a pull-down unit, a control unit and an auxiliary pull-down unit. The input unit is put in use for outputting a driving control voltage according to at least one first input signal. The pull-up unit pulls up a corresponding gate signal according to the driving control voltage and a system clock. The pull-down unit pulls down the corresponding gate signal to a first power voltage according to a control signal. The control unit is utilized for generating the control signal according to the corresponding gate signal. The auxiliary pull-down unit pulls down the driving control voltage to a second power voltage according to a second input signal.

17 Claims, 9 Drawing Sheets

SHIFT REGISTER CIRCUIT

BACKGROUND OF THE INVENTION

1. Field of the Invention

The present invention relates to a shift register circuit, and more particularly, to a shift register circuit having low power consumption.

2. Description of the Prior Art

Liquid crystal displays (LCDs) have advantages of a thin profile, low power consumption, and low radiation, and are broadly adopted for application in media players, mobile phones, personal digital assistants (PDAs), computer displays, and flat screen televisions. The operation of a liquid crystal display is featured by modulating voltage drops between opposite sides of a liquid crystal layer for twisting the angles of the liquid crystal molecules in the liquid crystal layer so that the transmittance of the liquid crystal layer can be controlled for illustrating images with the aid of light source provided by a backlight module. In general, the liquid crystal display comprises plural pixel units, a source driver, and a shift register circuit. The source driver is utilized for providing plural data signals to be written into the pixel units. The shift register circuit comprises a plurality of shift register stages and functions to generate plural gate signals for controlling the operations of writing the data signals into the pixel units. That is, the shift register circuit is a crucial device for providing a control of writing the data signals into the pixel units.

Figure 1:
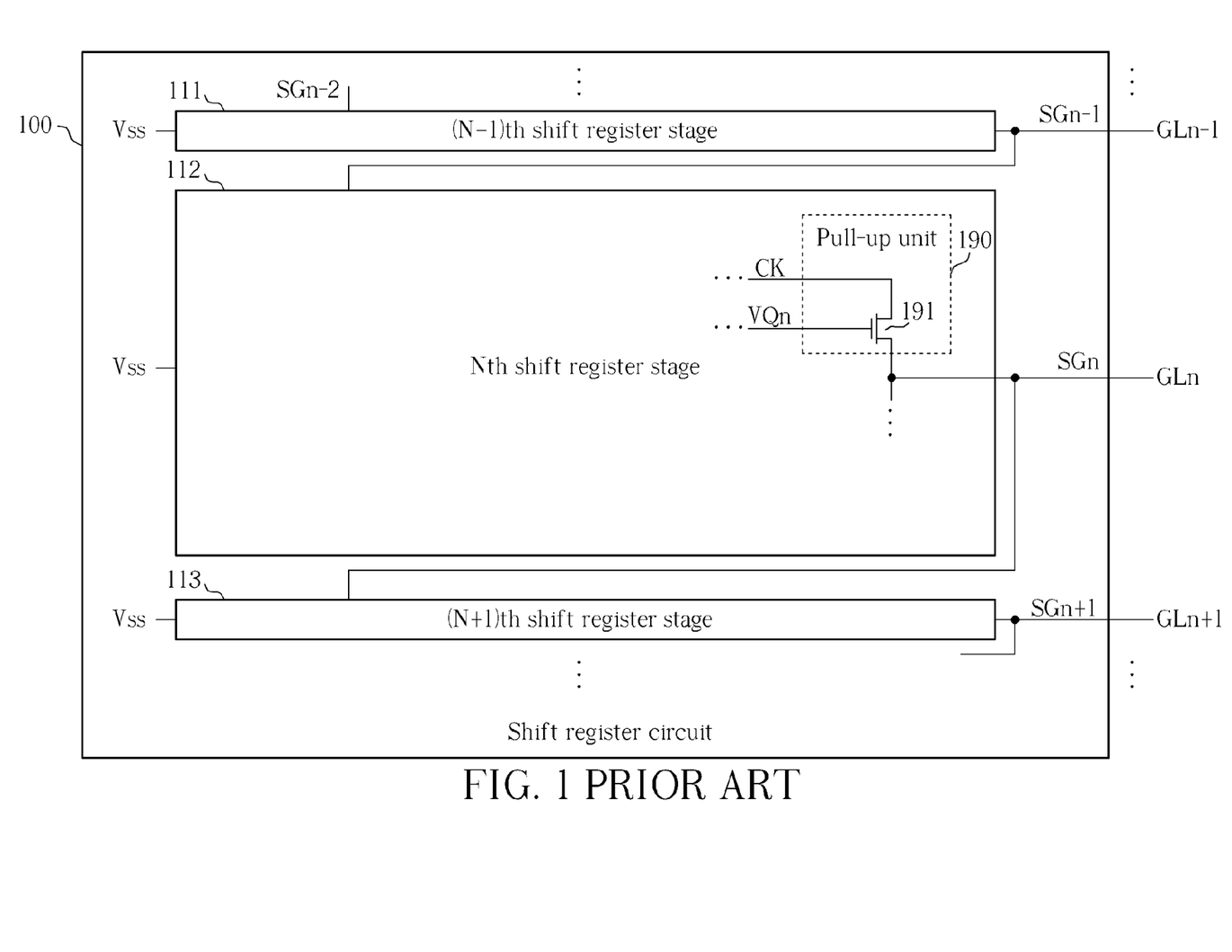
FIG. 1 is a schematic diagram showing a prior art shift register circuit.

FIG. 1 is a schematic diagram showing a prior art shift register circuit. As shown in FIG. 1, the shift register circuit 100 comprises a plurality of shift register stages and, for ease of explanation, illustrates an (N−1)th shift register stage 111, an Nth shift register stage 112 and an (N+1)th shift register stage 113. Each shift register stage is employed to generate one corresponding gate signal furnished to one corresponding gate line according to a low power voltage Vss and a gate signal generated by the preceding shift register stage. For instance, the (N−1)th shift register stage 111 is utilized for generating a gate signal SGn−1 furnished to a gate line GLn−1 according to the low power voltage Vss and a gate signal SGn−2, the Nth shift register stage 112 is utilized for generating a gate signal SGn furnished to a gate line GLn according to the low power voltage Vss and the gate signal SGn−1, and the (N+1)th shift register stage 113 is utilized for generating a gate signal SGn+1 furnished to a gate line GLn+1 according to the low power voltage Vss and the gate signal SGn. In the operation of the Nth shift register stage 112, the pull-up unit 190 thereof has a pull-up transistor 191 which is employed to pull up the gate signal SGn according to a driving control voltage VQn. However, if the driving control voltage VQn and the gate signal SGn are both at the low power voltage Vss, a leakage current will occur to the pull-up transistor 191 following the high-level voltage of a system clock CK. The leakage current becomes even worse as the high-level voltage of the system clock CK is increased for enhancing pixel charging rate, thereby resulting in high power consumption. Besides, if the shift register circuit 100 is integrated in a display panel comprising pixel array to bring the cost down, i.e. based on a gate-driver on array (GOA) architecture, the aforementioned high power consumption will boost the temperature of the display panel, which not only degrades panel display quality but also reduces lifetime of the display panel.

SUMMARY OF THE INVENTION

In accordance with an embodiment of the present invention, a shift register circuit is disclosed for providing plural gate signals to plural gate lines. The shift register circuit comprises a plurality of shift register stages. And an Nth shift register stage of the shift register stages comprises an input unit, a pull-up unit, an energy-store unit, a carry unit, a pull-down unit, a control unit, and an auxiliary pull-down unit.

The input unit is utilized for outputting a driving control voltage according to at least one first input signal. The pull-up unit, electrically connected to the input unit and an Nth gate line of the gate lines, is utilized for pulling up an Nth gate signal of the gate signals according to the driving control voltage and a system clock. The Nth gate line is employed to transmit the Nth gate signal. The energy-store unit, electrically connected to the pull-up unit and the input unit, is put in use for performing a charging/discharging process based on the driving control voltage. The carry unit, electrically connected to the input unit, is utilized for outputting an Nth start pulse signal according to the driving control voltage and the system clock. The pull-down unit, electrically connected to the Nth gate line, is utilized for pulling down the Nth gate signal to a first power voltage according to a control signal. The control unit, electrically connected to the pull-down unit and the Nth gate line, is utilized for generating the control signal according to the Nth gate signal. The auxiliary pull-down unit, electrically connected to the input unit, is utilized for pulling down the driving control voltage to a second power voltage according to a second input signal.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 2:
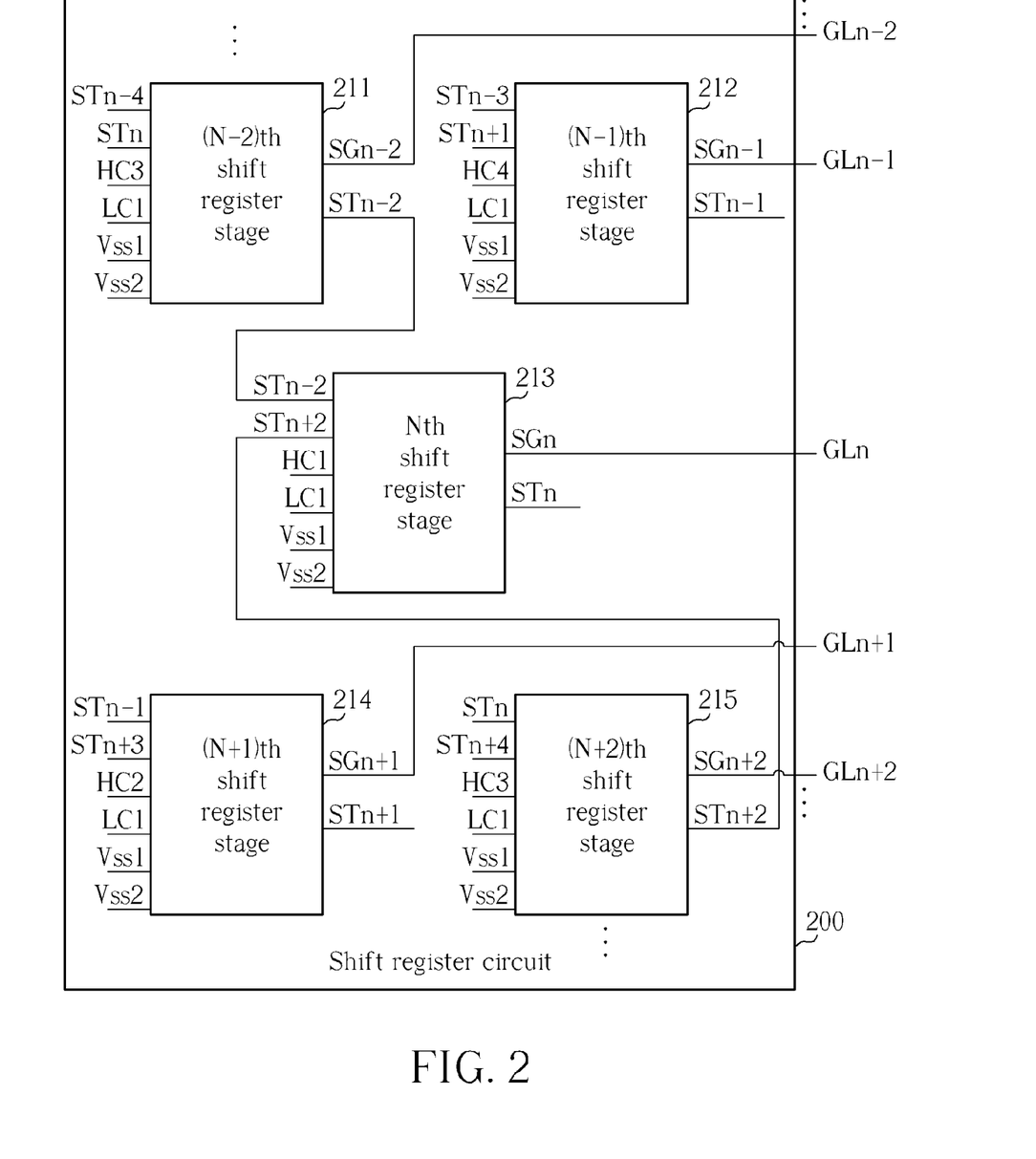
FIG. 2 is a schematic diagram showing a shift register circuit in accordance with a first embodiment of the present invention.

FIG. 2 is a schematic diagram showing a shift register circuit in accordance with a first embodiment of the present invention. As shown in FIG. 2, the shift register circuit 200 comprises a plurality of shift register stages and, for ease of explanation, illustrates an (N−2)th shift register stage 211, an (N−1)th shift register stage 212, an Nth shift register stage 213, an (N+1)th shift register stage 214 and an (N+2)th shift register stage 215. In the operation of the shift register circuit 200, the Nth shift register stage 213 is utilized for performing a low power consumption operation to generate a gate signal SGn and a start pulse signal STn according to a start pulse signal STn−2 generated by the (N−2)th shift register stage 211, a start pulse signal STn+2 generated by the (N+2)th shift register stage 215, a first system clock HC1, a first low-frequency clock LC1, a first power voltage Vss1, and a second power voltage Vss2 different from the first power voltage Vss1. The circuit functions of other shift register stages are similar to the Nth shift register stage 213 and can be inferred by analogy. Regarding the system clocks HC1-HC4 shown in FIG. 2, it is noted that the third system clock HC3 has a phase opposite to the first system clock HC1, the second system clock HC2 has a 90-degree phase difference relative to the first system clock HC1, and the fourth system clock HC4 has a phase opposite to the second system clock HC2.

In another embodiment, the shift register stages of the shift register circuit 200 are employed to perform a low power consumption operation based on a two-system-clock mechanism in conjunction with the first and second power voltages Vss1, Vss2. Alternatively, the Nth shift register stage 213 functions to perform a low power consumption operation for generating the gate signal SGn and the start pulse signal STn according to the start pulse signal STn−1 or the gate signal SGn−1 generated by the (N−1)th shift register stage 212, the start pulse signal STn+1 or the gate signal SGn+1 generated by the (N+1)th shift register stage 214, the first system clock HC1, the first low-frequency clock LC1, the first power voltage Vss1 and the second power voltage Vss2.

Figure 3:
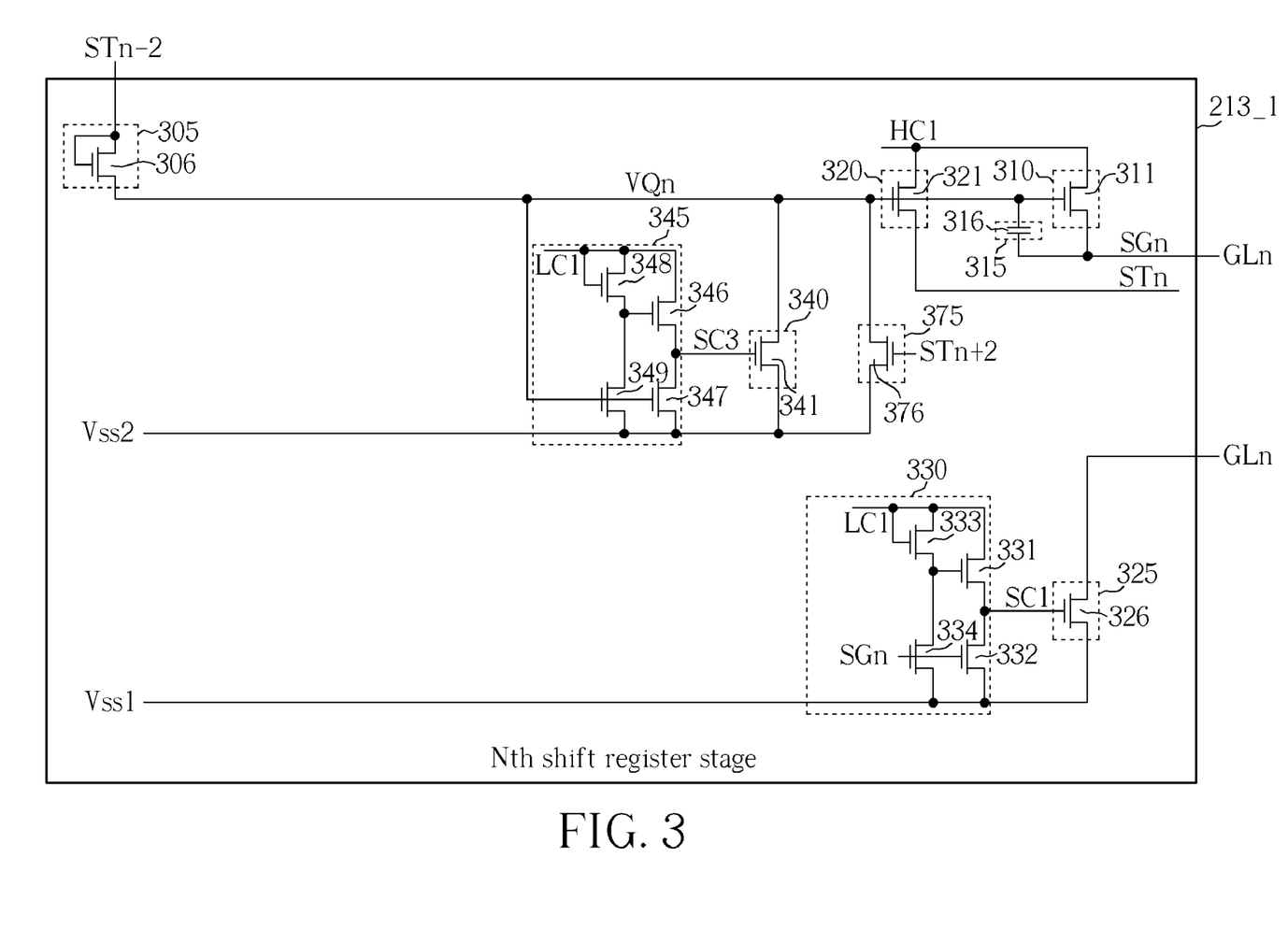
FIG. 3 is a schematic circuit diagram illustrating a first embodiment of the Nth shift register stage shown in FIG. 2.

FIG. 3 is a schematic circuit diagram illustrating a first embodiment of the Nth shift register stage shown in FIG. 2. As shown in FIG. 3, the Nth shift register stage 213_1 comprises an input unit 305, a pull-up unit 310, an energy-store unit 315, a carry unit 320, a first pull-down unit 325, a first control unit 330, a first auxiliary pull-down unit 375, a second auxiliary pull-down unit 340, and a third control unit 345. The input unit 305, electrically connected to the (N−2)th shift register stage 211, is utilized for outputting a driving control voltage VQn according to the start pulse signal STn−2. The energy-store unit 315, electrically connected to the input unit 305 and the pull-up control unit 310, functions to perform a charging/discharging process based on the driving control voltage VQn. The carry unit 320, electrically connected to the input unit 305, is utilized for outputting the start pulse signal STn according to the driving control voltage VQn and the first system clock HC1.

The pull-up unit 310, electrically connected to the input unit 305 and the gate line GLn, is utilized for pulling up the gate signal SGn of the gate line GLn according to the driving control voltage VQn and the first system clock HC1. The first pull-down unit 325, electrically connected to the first control unit 330 and the gate line GLn, is utilized for pulling down the gate signal SGn to the first power voltage Vss1 according to a first control signal SC1. In one embodiment, the pull-up unit 310 is connected to a first node of the gate line GLn, and the first pull-down unit 325 is connected to a second node of the gate line GLn which is different from the first node of the gate line GLn, e.g. the pull-up unit 310 and the first pull-down unit 325 may be preferably connected to opposite ends of the gate line GLn respectively. In another embodiment, the pull-up unit 310 and the first pull-down unit 325 are connected to one and the same node of the gate line GLn, e.g. both the pull-up unit 310 and the first pull-down unit 325 may be preferably connected to either end of the gate line GLn.

The first control unit 330, electrically connected to the first pull-down unit 325, is utilized for generating the first control signal SC1 according to the gate signal SGn and the first low-frequency clock LC1. The first auxiliary pull-down unit 375, electrically connected to the input unit 305, is utilized for pulling down the driving control voltage VQn to the second power voltage Vss2 according to the start pulse signal STn+2. The second auxiliary pull-down unit 340, electrically connected to the input unit 305, is utilized for pulling down the driving control voltage VQn to the second power voltage Vss2 according to a third control signal SC3. The third control unit 345, electrically connected to the second auxiliary pull-down unit 340 and the input unit 305, is utilized for generating the third control signal SC3 according to the driving control voltage VQn and the first low-frequency clock LC1.

In the embodiment shown in FIG. 3, the input unit 305 comprises a first transistor 306, the pull-up unit 310 comprises a second transistor 311, the energy-store unit 315 comprises a capacitor 316, the carry unit 320 comprises a third transistor 321, the first pull-down unit 325 comprises a fourth transistor 326, the first control unit 330 comprises a fifth transistor 331, a sixth transistor 332, a seventh transistor 333 and an eighth transistor 334, the first auxiliary pull-down unit 375 comprises an eleventh transistor 376, the second auxiliary pull-down unit 340 comprises a nineteenth transistor 341, and the third control unit 345 comprises a twenty-first transistor 346, a twenty-second transistor 347, a twenty-third transistor 348 and a twenty-fourth transistor 349. It is noted that each of the transistors aforementioned or to be mentioned may be a thin film transistor (TFT), a field effect transistor (FET) or other similar device having connection/disconnection switching functionality.

The first transistor 306 comprises a first end electrically connected to the (N−2)th shift register stage 211 for receiving the start pulse signal STn−2 or other pulse having similar function, a gate end electrically connected to the first end, and a second end for outputting the driving control voltage VQn. The second transistor 311 comprises a first end for receiving the first system clock HC1, a gate end electrically connected to the second end of the first transistor 306 for receiving the driving control voltage VQn, and a second end electrically connected to the gate line GLn. The capacitor 316 is electrically connected between the gate and second ends of the second transistor 311. The third transistor 321 comprises a first end for receiving the first system clock HC1, a gate end electrically connected to the second end of the first transistor 306 for receiving the driving control voltage VQn, and a second end for outputting the start pulse signal STn.

The fourth transistor 326 comprises a first end electrically connected to the gate line GLn, a gate end for receiving the first control signal SC1, and a second end for receiving the first power voltage Vss1. The fifth transistor 331 comprises a first end for receiving the first low-frequency clock LC1, a second end for outputting the first control signal SC1, and a gate end. The sixth transistor 332 comprises a first end electrically connected to the second end of the fifth transistor 331, a gate end electrically connected to the gate line GLn for receiving the gate signal SGn, and a second end for receiving the first power voltage Vss1. The seventh transistor 333 comprises a first end for receiving the first low-frequency clock LC1, a gate end electrically connected to the first end, and a second end electrically connected to the gate end of the fifth transistor 331. The eighth transistor 334 comprises a first end electrically connected to the second end of the seventh transistor 333, a gate end electrically connected to the gate line GLn for receiving the gate signal SGn, and a second end for receiving the first power voltage Vss1. The circuit operations regarding the fifth through eighth transistors 331-334 are well known to those skilled in the art and, for the sake of brevity, further discussion thereof is omitted.

The eleventh transistor 376 comprises a first end electrically connected to the second end of the first transistor 306, a gate end electrically connected to the (N+2)th shift register stage 215 for receiving the start pulse signal STn+2, and a second end for receiving the second power voltage Vss2. The nineteenth transistor 341 comprises a first end electrically connected to the second end of the first transistor 306, a gate end for receiving the third control signal SC3, and a second end for receiving the second power voltage Vss2. The twenty-first transistor 346 comprises a first end for receiving the first low-frequency clock LC1, a second end for outputting the third control signal SC3, and a gate end. The twenty-second transistor 347 comprises a first end electrically connected to the second end of the twenty-first transistor 346, a gate end for receiving the driving control voltage VQn, and a second end for receiving the second power voltage Vss2. The twenty-third transistor 348 comprises a first end for receiving the first low-frequency clock LC1, a gate end electrically connected to the first end, and a second end electrically connected to the gate end of the twenty-first transistor 346. The twenty-fourth transistor 349 comprises a first end electrically connected to the second end of the twenty-third transistor 348, a gate end for receiving the driving control voltage VQn, and a second end for receiving the second power voltage Vss2.

In the operation of the Nth shift register stage 213_1, the first power voltage Vss1 is greater than the second power voltage Vss2. For that reason, as the driving control voltage VQn is pulled down to the second power voltage Vss2 and the gate signal SGn is pulled down to the first power voltage Vss1, a reverse bias is applied between the gate and second ends of the second transistor 311, for suppressing the leakage current thereof caused by the high-level voltage of the first system clock HC1. Consequently, the power consumption of the shift register circuit 200 can be significantly reduced, thereby lowering panel temperature to enhance panel display quality and extend panel lifetime.

Figure 4:
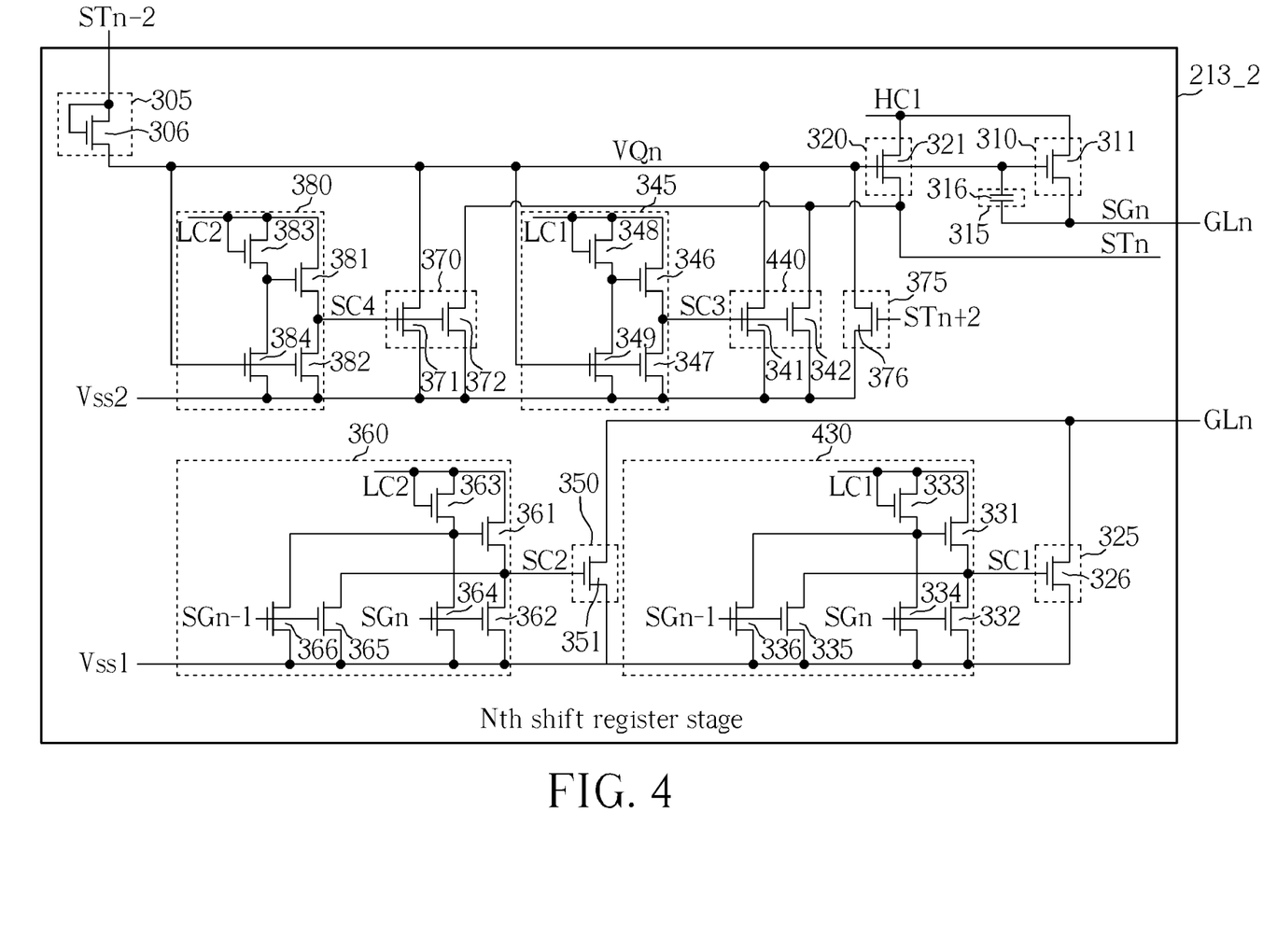
FIG. 4 is a schematic circuit diagram illustrating a second embodiment of the Nth shift register stage shown in FIG. 2.

FIG. 4 is a schematic circuit diagram illustrating a second embodiment of the Nth shift register stage shown in FIG. 2. As shown in FIG. 4, the Nth shift register stage 213_2 is similar to the Nth shift register stage 213_1 shown in FIG. 3, differing in that the first control unit 330 is replaced with a first control unit 430, the second auxiliary pull-down unit 340 is replaced with a second auxiliary pull-down unit 440, and a second pull-down unit 350, a second control unit 360, a third auxiliary pull-down unit 370 and a fourth control unit 380 are further added.

The second pull-down unit 350 is utilized for pulling down the gate signal SGn to the first power voltage Vss1 according to a second control signal SC2. The second control unit 360 is utilized for generating the second control signal SC2 according to the gate signal SGn, the gate signal SGn−1 and a second low-frequency clock LC2 having a phase opposite to the first low-frequency clock LC1. The third auxiliary pull-down unit 370 is utilized for pulling down the driving control voltage VQn and the start pulse signal STn to the second power voltage Vss2 according to a fourth control signal SC4. The fourth control unit 380 is utilized for generating the fourth control signal SC4 according to the driving control voltage VQn and the second low-frequency clock LC2.

Compared with the first control unit 330, the first control unit 430 further comprises a ninth transistor 335 and a tenth transistor 336. Compared with the second auxiliary pull-down unit 340, the second pull-down unit 440 further comprises a twentieth transistor 342. Besides, the second pull-down unit 350 comprises a twelfth transistor 351, the second control unit 360 comprises a thirteenth transistor 361, a fourteenth transistor 362, a fifteenth transistor 363, a sixteenth transistor 364, a seventeenth transistor 365 and an eighteenth transistor 366, the third auxiliary pull-down unit 370 comprises a twenty-fifth transistor 371 and a twenty-sixth transistor 372, and the fourth control unit 380 comprises a twenty-seventh transistor 381, a twenty-eighth transistor 382, a twenty-ninth transistor 383 and a thirtieth transistor 384.

The twentieth transistor 342 comprises a first end electrically connected to the second end of the third transistor 321, a gate end for receiving the third control signal SC3, and a second end for receiving the second power voltage Vss2. That is, the twentieth transistor 342 is utilized for pulling down the start pulse signal STn to the second power voltage Vss2 according to the third control signal SC3.

The ninth transistor 335 comprises a first end electrically connected to the second end of the fifth transistor 331, a gate end electrically connected to the (N−1)th shift register stage 212 for receiving the gate signal SGn−1, and a second end for receiving the first power voltage Vss1. That is, the ninth transistor 335 is utilized for pulling down the first control signal SC1 to the first power voltage Vss1 according to the gate signal SGn−1. The tenth transistor 336 comprises a first end electrically connected to the gate end of the fifth transistor 331, a gate end electrically connected to the (N−1)th shift register stage 212 for receiving the gate signal SGn−1, and a second end for receiving the first power voltage Vss1. That is, the tenth transistor 336 is utilized for pulling down the gate voltage of the fifth transistor 331 to the first power voltage Vss1.

The twelfth transistor 351 comprises a first end electrically connected to the gate line GLn, a gate end for receiving the second control signal SC2, and a second end for receiving the first power voltage Vss1. The thirteenth transistor 361 comprises a first end for receiving the second low-frequency clock LC2, a second end for outputting the second control signal SC2, and a gate end. The fourteenth transistor 362 comprises a first end electrically connected to the second end of the thirteenth transistor 361, a gate end electrically connected to the gate line GLn for receiving the gate signal SGn, and a second end for receiving the first power voltage Vss1. The fifteenth transistor 363 comprises a first end for receiving the second low-frequency clock LC2, a gate end electrically connected to the first end, and a second end electrically connected to the gate end of the thirteenth transistor 361. The sixteenth transistor 364 comprises a first end electrically connected to the second end of the fifteenth transistor 363, a gate end electrically connected to the gate line GLn for receiving the gate signal SGn, and a second end for receiving the first power voltage Vss1.

The seventeenth transistor 365 comprises a first end electrically connected to the second end of the thirteenth transistor 361, a gate end electrically connected to the (N−1)th shift register stage 212 for receiving the gate signal SGn−1, and a second end for receiving the first power voltage Vss1. The eighteenth transistor 366 comprises a first end electrically connected to the gate end of the thirteenth transistor 361, a gate end electrically connected to the (N−1)th shift register stage 212 for receiving the gate signal SGn−1, and a second end for receiving the first power voltage Vss1.

The twenty-fifth transistor 371 comprises a first end electrically connected to the second end of the first transistor 306, a gate end for receiving the fourth control signal SC4, and a second end for receiving the second power voltage Vss2. The twenty-sixth transistor 372 comprises a first end electrically connected to the second end of the third transistor 321, a gate end for receiving the fourth control signal SC4, and a second end for receiving the second power voltage Vss2. The twenty-seventh transistor 381 comprises a first end for receiving the second low-frequency clock LC2, a second end for outputting the fourth control signal SC4. The twenty-eighth transistor 382 comprises a first end electrically connected to the second end of the twenty-seventh transistor 381, a gate end for receiving the driving control voltage VQn, and a second end for receiving the second power voltage Vss2. The twenty-ninth transistor 383 comprises a first end for receiving the second low-frequency clock LC2, a gate end electrically connected to the first end, and a second end electrically connected to the gate end of the twenty-seventh transistor 381. The thirtieth transistor 384 comprises a first end electrically connected to the second end of the twenty-ninth transistor 383, a gate end for receiving the driving control voltage VQn, and a second end for receiving the second power voltage Vss2.

Figure 5:
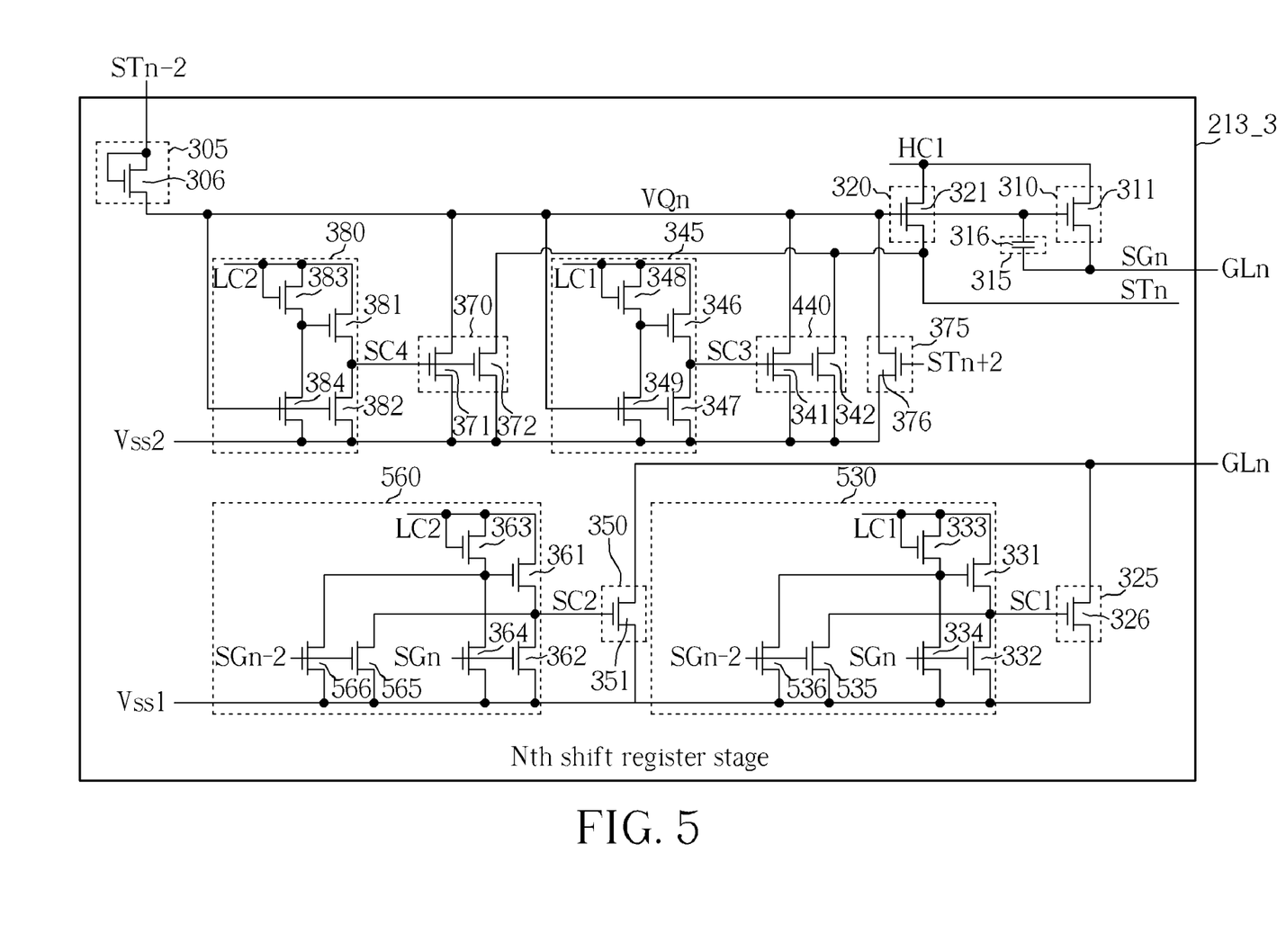
FIG. 5 is a schematic circuit diagram illustrating a third embodiment of the Nth shift register stage shown in FIG. 2.

FIG. 5 is a schematic circuit diagram illustrating a third embodiment of the Nth shift register stage shown in FIG. 2. As shown in FIG. 5, the Nth shift register stage 213_3 is similar to the Nth shift register stage 213_2 shown in FIG. 4, differing primarily in comprising a first control unit 530 and a second control unit 560 instead of the first control unit 430 and the second control unit 360. Further, the first control unit 530 is similar to the first control unit 430, differing in that the ninth transistor 335 and the tenth transistor 336 are replaced with a ninth transistor 535 and a tenth transistor 536 respectively. Also, the second control unit 560 is similar to the second control unit 360, differing in that the seventeenth transistor 365 and the eighteenth transistor 366 are replaced with a seventeenth transistor 565 and an eighteenth transistor 566 respectively.

The ninth transistor 535 comprises a first end electrically connected to the second end of the fifth transistor 331, a gate end electrically connected to the (N−2)th shift register stage 211 for receiving the gate signal SGn−2, and a second end for receiving the first power voltage Vss1. The tenth transistor 536 comprises a first end electrically connected to the gate end of the fifth transistor 331, a gate end electrically connected to the (N−2)th shift register stage 211 for receiving the gate signal SGn−2, and a second end for receiving the first power voltage Vss1.

The seventeenth transistor 565 comprises a first end electrically connected to the second end of the thirteenth transistor 361, a gate end electrically connected to the (N−2)th shift register stage 211 for receiving the gate signal SGn−2, and a second end for receiving the first power voltage Vss1. The eighteenth transistor 566 comprises a first end electrically connected to the gate end of the thirteenth transistor 361, a gate end electrically connected to the (N−2)th shift register stage 211 for receiving the gate signal SGn−2, and a second end for receiving the first power voltage Vss1.

Figure 6:
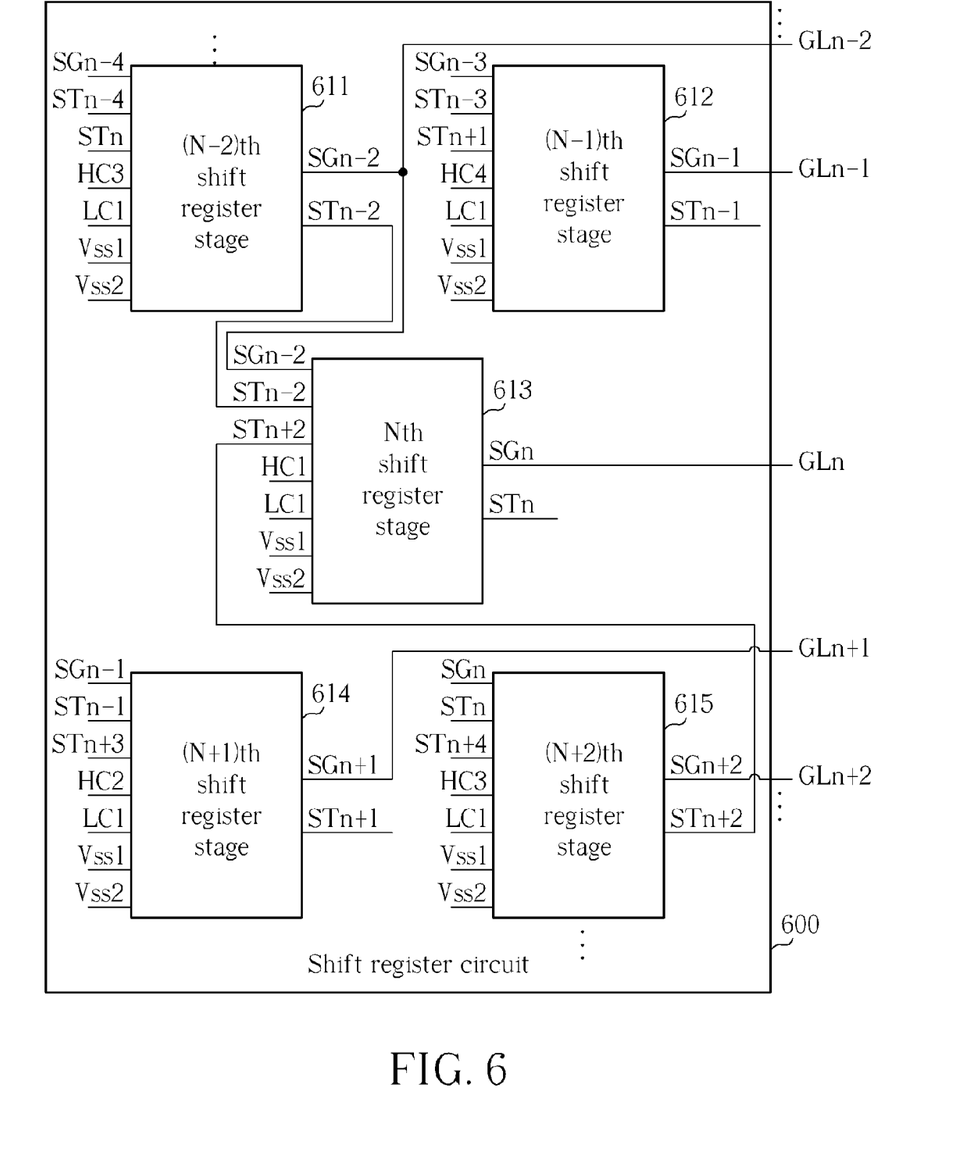
FIG. 6 is a schematic diagram showing a shift register circuit in accordance with a second embodiment of the present invention.

FIG. 6 is a schematic diagram showing a shift register circuit in accordance with a second embodiment of the present invention. As shown in FIG. 6, the shift register circuit 600 comprises a plurality of shift register stages and, for ease of explanation, illustrates an (N−2)th shift register stage 611, an (N−1)th shift register stage 612, an Nth shift register stage 613, an (N+1)th shift register stage 614 and an (N+2)th shift register stage 615. In the operation of the shift register circuit 600, the Nth shift register stage 613 is utilized for performing a low power consumption operation to generate a gate signal SGn and a start pulse signal STn according to a gate signal SGn−2 and a start pulse signal STn−2 generated by the (N−2)th shift register stage 611, a start pulse signal STn+2 generated by the (N+2)th shift register stage 615, a first system clock HC1, a first low-frequency clock LC1, a first power voltage Vss1, and a second power voltage Vss2 different from the first power voltage Vss1. The circuit functions of other shift register stages are similar to the Nth shift register stage 613 and can be inferred by analogy. Regarding the system clocks HC1-HC4 shown in FIG. 6, it is noted that the third system clock HC3 has a phase opposite to the first system clock HC1, the second system clock HC2 has a 90-degree phase difference relative to the first system clock HC1, and the fourth system clock HC4 has a phase opposite to the second system clock HC2.

In another embodiment, the shift register stages of the shift register circuit 600 are employed to perform a low power consumption operation based on a two-system-clock mechanism in conjunction with the first and second power voltages Vss1, Vss2. Alternatively, the Nth shift register stage 613 functions to perform a low power consumption operation for generating the gate signal SGn and the start pulse signal STn according to the gate signal SGn−1 and the start pulse signal STn−1 generated by the (N−1)th shift register stage 612, the start pulse signal STn+1 or the gate signal SGn+1 generated by the (N+1)th shift register stage 614, the first system clock HC1, the first low-frequency clock LC1, the first power voltage Vss1 and the second power voltage Vss2.

Figure 7:
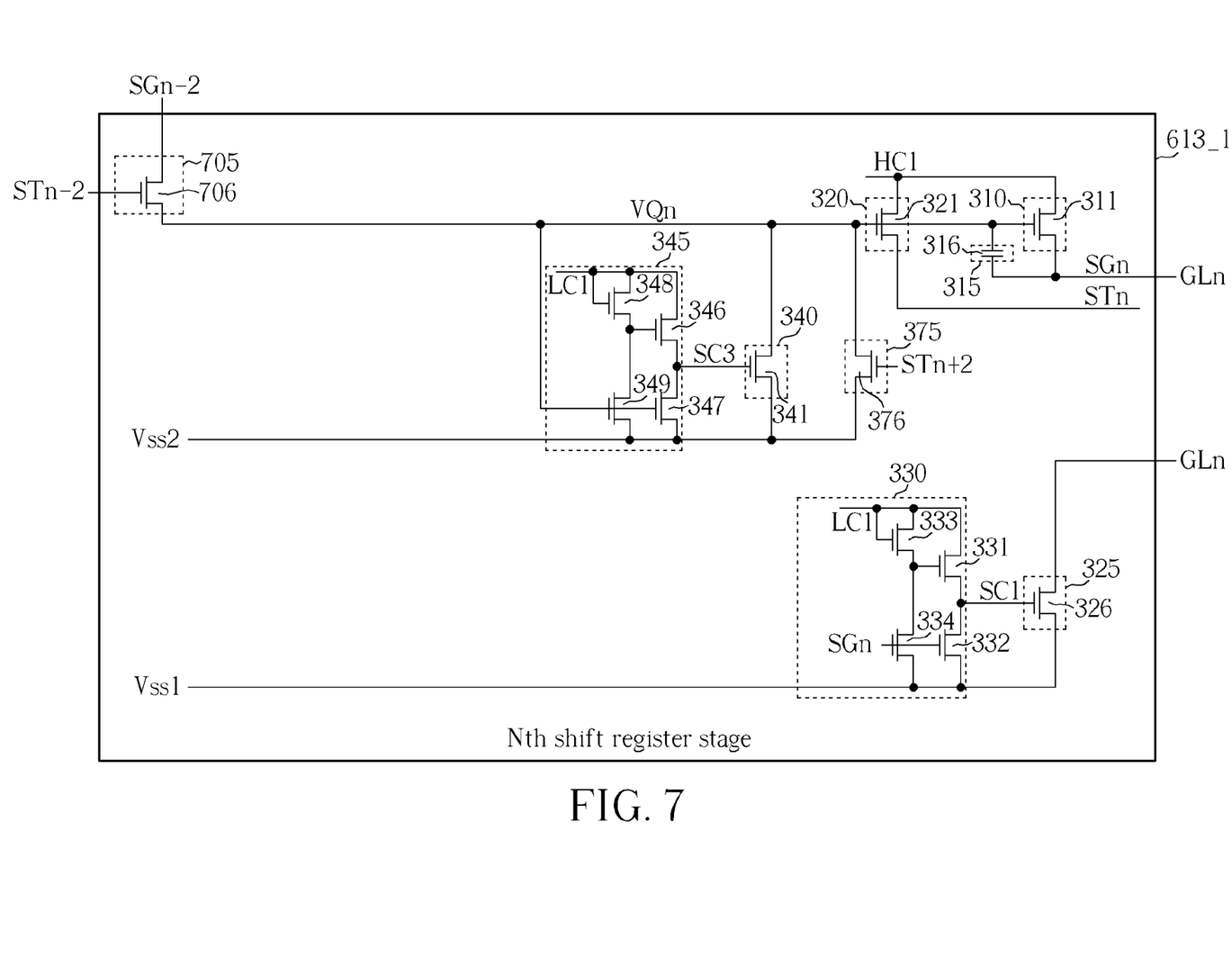
FIG. 7 is a schematic circuit diagram illustrating a first embodiment of the Nth shift register stage shown in FIG. 6.

FIG. 7 is a schematic circuit diagram illustrating a first embodiment of the Nth shift register stage shown in FIG. 6. As shown in FIG. 7, the Nth shift register stage 613_1 is similar to the Nth shift register stage 213_1 shown in FIG. 3, differing in that the input unit 305 is replaced with an input unit 705 having a first transistor 706. The first transistor 706 comprises a first end electrically connected to the (N−2)th shift register stage 611 for receiving the gate signal SGn−2, a gate end electrically connected to the (N−2)th shift register stage 611 for receiving the start pulse signal STn−2, and a second end for outputting a driving control voltage VQn. That is, the input unit 705 is utilized for outputting the driving control voltage VQn according to the gate signal SGn−2 and the start pulse signal STn−2. The interconnections and circuit functions of other units of the Nth shift register stage 613_1 are similar to those of the Nth shift register stage 213_1 shown in FIG. 3, and are not repeated here. Likewise, since the first power voltage Vss1 is greater than the second power voltage Vss2, as the driving control voltage VQn is pulled down to the second power voltage Vss2 and the gate signal SGn is pulled down to the first power voltage Vss1, a reverse bias is applied between the gate and second ends of the second transistor 311 in the Nth shift register stage 613_1, for suppressing the leakage current thereof caused by the high-level voltage of the first system clock HC1. Consequently, the power consumption of the shift register circuit 600 can be significantly reduced, thereby lowering panel temperature to enhance panel display quality and extend panel lifetime.

Figure 8:
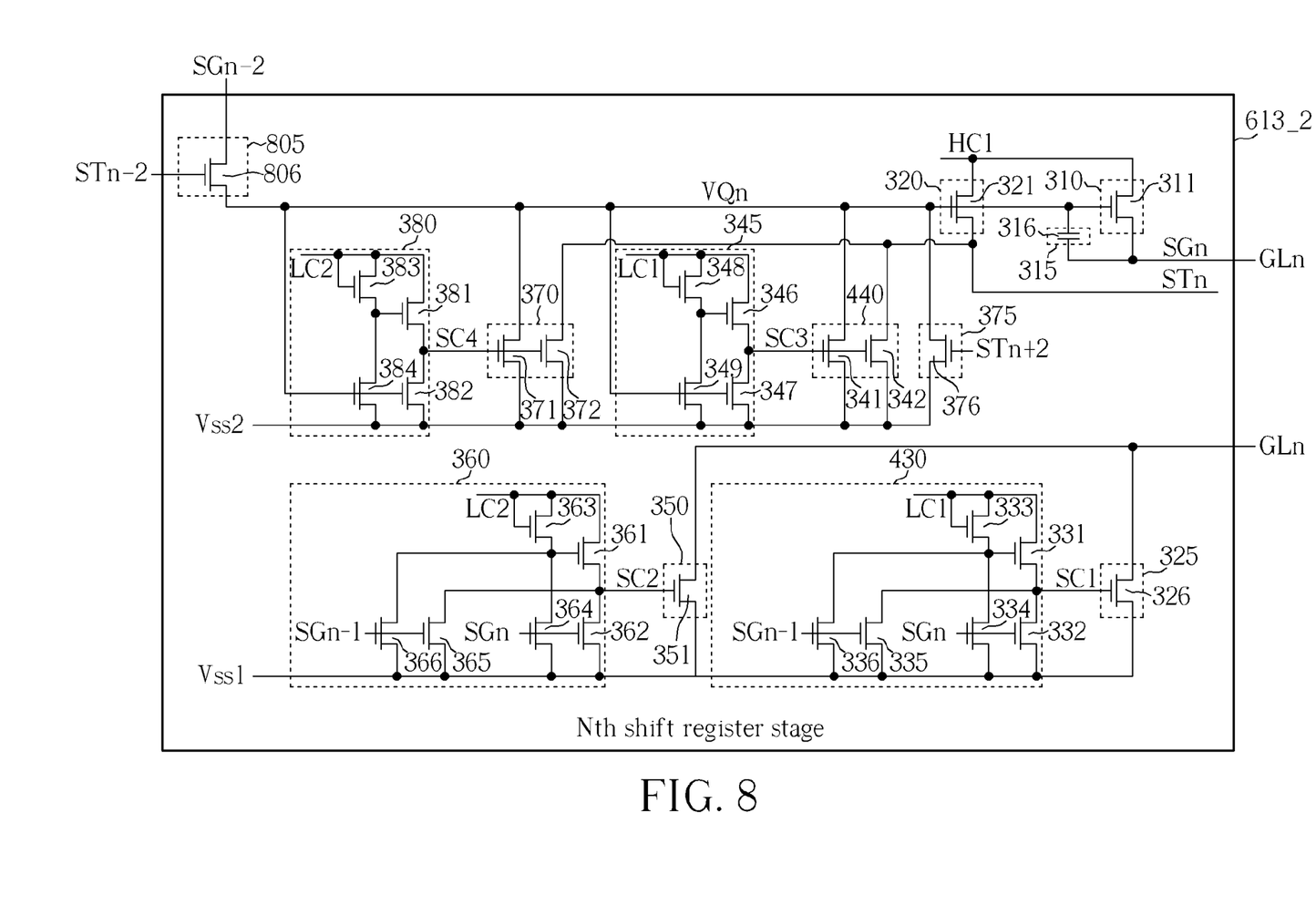
FIG. 8 is a schematic circuit diagram illustrating a second embodiment of the Nth shift register stage shown in FIG. 6.

FIG. 8 is a schematic circuit diagram illustrating a second embodiment of the Nth shift register stage shown in FIG. 6. As shown in FIG. 8, the Nth shift register stage 613_2 is similar to the Nth shift register stage 213_2 shown in FIG. 4, differing in that the input unit 305 is replaced with an input unit 805 having a first transistor 806. The first transistor 806 comprises a first end electrically connected to the (N−2)th shift register stage 611 for receiving the gate signal SGn−2, a gate end electrically connected to the (N−2)th shift register stage 611 for receiving the start pulse signal STn−2, and a second end for outputting a driving control voltage VQn. That is, the input unit 805 is utilized for outputting the driving control voltage VQn according to the gate signal SGn−2 and the start pulse signal STn−2. The interconnections and circuit functions of other units of the Nth shift register stage 613_2 are similar to those of the Nth shift register stage 213_2 shown in FIG. 4, and are not repeated here.

Figure 9:
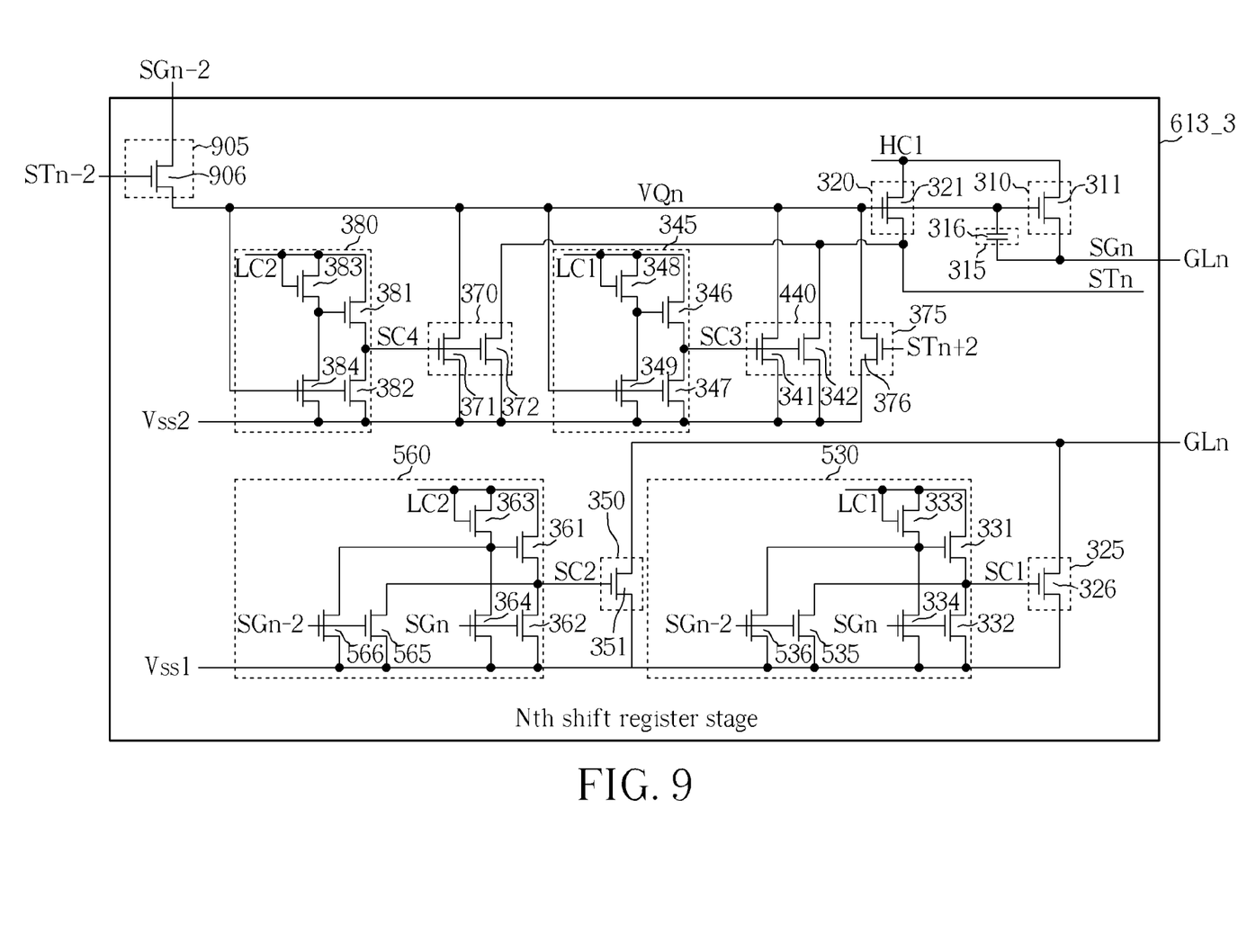
FIG. 9 is a schematic circuit diagram illustrating a third embodiment of the Nth shift register stage shown in FIG. 6.

FIG. 9 is a schematic circuit diagram illustrating a third embodiment of the Nth shift register stage shown in FIG. 6. As shown in FIG. 9, the Nth shift register stage 613_3 is similar to the Nth shift register stage 213_3 shown in FIG. 5, differing in that the input unit 305 is replaced with an input unit 905 having a first transistor 906. The first transistor 906 comprises a first end electrically connected to the (N–2)th shift register stage 611 for receiving the gate signal SGn–2, a gate end electrically connected to the (N–2)th shift register stage 611 for receiving the start pulse signal STn–2, and a second end for outputting a driving control voltage VQn. That is, the input unit 905 is utilized for outputting the driving control voltage VQn according to the gate signal SGn–2 and the start pulse signal STn–2. The interconnections and circuit functions of other units of the Nth shift register stage 613_3 are similar to those of the Nth shift register stage 213_3 shown in FIG. 5, and are not repeated here.

To sum up, in the operation of the shift register circuit according to the present invention, the first power voltage for pulling down the gate signal is greater than the second power voltage for pulling down the driving control voltage. Accordingly, as the gate signal is pulled down to the first power voltage and the driving control voltage is pulled down to the second power voltage, the transistor for pulling up the gate signal is reversely biased for suppressing related leakage current caused by the high-level voltage of system clock. As a result, the power consumption of the shift register circuit can be significantly reduced, thereby lowering panel temperature to enhance panel display quality and extend panel lifetime.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A shift register circuit for providing plural gate signals to plural gate lines, the shift register circuit comprising a plurality of shift register stages, an Nth shift register stage of the shift register stages comprising:
    an input unit for outputting a driving control voltage according to at least one first input signal;
    a pull-up unit, electrically connected to the input unit and an Nth gate line of the gate lines, for pulling up an Nth gate signal of the gate signals according to the driving control voltage and a system clock, wherein the Nth gate line is employed to transmit the Nth gate signal;
    an energy-store unit, electrically connected to the pull-up unit and the input unit, for performing a charging/discharging process based on the driving control voltage;
    a carry unit, electrically connected to the input unit, for outputting an Nth start pulse signal according to the driving control voltage and the system clock;
    a first pull-down unit, electrically connected to the Nth gate line, for pulling down the Nth gate signal to a first power voltage according to a first control signal;
    a first control unit, electrically connected to the first pull-down unit and the Nth gate line, for generating the first control signal according to the Nth gate signal;
    a first auxiliary pull-down unit, electrically connected to the input unit, for pulling down the driving control voltage to a second power voltage according to a second input signal;
    a second auxiliary pull-down unit, electrically connected to the carry unit and the input unit, for pulling down the driving control voltage and the Nth start pulse signal to the second power voltage according to a third control signal; and
    a third control unit, electrically connected to the second auxiliary pull-down unit and the input unit, for generating the third control signal according to the driving control voltage.

2. The shift register circuit of claim 1, wherein the pull-up unit is electrically connected to a first node of the Nth gate line, and the first pull-down unit is electrically connected to a second node of the Nth gate line which is different from the first node of the Nth gate line.

3. The shift register circuit of claim 1, wherein the pull-up unit and the first pull-down unit are electrically connected to a same node of the Nth gate line.

4. The shift register circuit of claim 1, wherein the first power voltage is greater than the second power voltage.

5. The shift register circuit of claim 1, wherein the input unit comprises a first transistor having a first end electrically connected to an (N–2)th shift register stage of the shift register stages for receiving an (N–2)th start pulse signal, a gate end electrically connected to the first end, and a second end for outputting the driving control voltage.

6. The shift register circuit of claim 1, wherein the input unit comprises a first transistor having a first end electrically connected to an (N–2)th shift register stage of the shift register stages for receiving an (N–2)th gate signal of the gate signals, a gate end electrically connected to the (N–2)th shift register stage for receiving an (N–2)th start pulse signal, and a second end for outputting the driving control voltage.

7. The shift register circuit of claim 1, wherein:
    the pull-up unit comprises a second transistor having a first end for receiving the system clock, a gate end for receiving the driving control voltage, and a second end electrically connected to the Nth gate line;
    the energy-store unit comprises a capacitor electrically connected between the gate and second ends of the second transistor; and
    the carry unit comprises a third transistor having a first end for receiving the system clock, a gate end for receiving the driving control voltage, and a second end for outputting the Nth start pulse signal.

8. The shift register circuit of claim 1, wherein:
    the first pull-down unit comprises:
        a fourth transistor having a first end electrically connected to the Nth gate line, a gate end for receiving the first control signal, and a second end for receiving the first power voltage;
    the first control unit comprises:
        a fifth transistor having a first end for receiving a first low-frequency clock, a gate end, and a second end for outputting the first control signal;
        a sixth transistor having a first end electrically connected to the second end of the fifth transistor, a gate end for receiving the Nth gate signal, and a second end for receiving the first power voltage;
        a seventh transistor having a first end for receiving the first low-frequency clock, a gate end for receiving the first low-frequency clock, and a second end electrically connected to the gate end of the fifth transistor; and an eighth transistor having a first end electrically connected to the second end of the seventh transistor, a gate end for receiving the Nth gate signal, and a second end for receiving the first power voltage; and the first auxiliary pull-down unit comprises an eleventh transistor having a first end electrically connected to the input unit, a gate end electrically connected to an (N+2)th shift register stage of the shift register stages for receiving an (N+2)th start pulse signal, and a second end for receiving the second power voltage.

9. The shift register circuit of claim 8, wherein the first control unit further comprises:

a ninth transistor having a first end electrically connected to the second end of the fifth transistor, a gate end electrically connected to an (N−1)th shift register stage of the shift register stages for receiving an (N−1)th gate signal of the gate signals, and a second end for receiving the first power voltage; and a tenth transistor having a first end electrically connected to the gate end of the fifth transistor, a gate end electrically connected to the (N−1)th shift register stage for receiving the (N−1)th gate signal, and a second end for receiving the first power voltage.

10. The shift register circuit of claim 8, wherein the first control unit further comprises:

a ninth transistor having a first end electrically connected to the second end of the fifth transistor, a gate end electrically connected to an (N−2)th shift register stage of the shift register stages for receiving an (N−2)th gate signal of the gate signals, and a second end for receiving the first power voltage; and a tenth transistor having a first end electrically connected to the gate end of the fifth transistor, a gate end electrically connected to the (N−2)th shift register stage for receiving the (N−2)th gate signal, and a second end for receiving the first power voltage.

11. The shift register circuit of claim 8, wherein the Nth shift register stage further comprises:

a second pull-down unit, electrically connected to the Nth gate line, for pulling down the Nth gate signal to the first power voltage according to a second control signal; and a second control unit, electrically connected to the second pull-down unit and the Nth gate line, for generating the second control signal according to the Nth gate signal.

12. The shift register circuit of claim 11, wherein:

the second pull-down unit comprises:

a twelfth transistor having a first end electrically connected to the Nth gate line, a gate end for receiving the second control signal, and a second end for receiving the first power voltage; and the second control unit comprises:

a thirteenth transistor having a first end for receiving a second low-frequency clock having a phase opposite to the first low-frequency clock, a gate end, and a second end for outputting the second control signal;

a fourteenth transistor having a first end electrically connected to the second end of the thirteenth transistor, a gate end for receiving the Nth gate signal, and a second end for receiving the first power voltage;

a fifteenth transistor having a first end for receiving the second low-frequency clock, a gate end for receiving the second low-frequency clock, and a second end electrically connected to the gate end of the thirteenth transistor; and a sixteenth transistor having a first end electrically connected to the second end of the fifteenth transistor, a gate end for receiving the Nth gate signal, and a second end for receiving the first power voltage.

13. The shift register circuit of claim 12, wherein the second control unit further comprises:

a seventeenth transistor having a first end electrically connected to the second end of the thirteenth transistor, a gate end electrically connected to an (N−1)th shift register stage of the shift register stages for receiving an (N−1)th gate signal of the gate signals, and a second end for receiving the first power voltage; and an eighteenth transistor having a first end electrically connected to the gate end of the thirteenth transistor, a gate end electrically connected to the (N−1)th shift register stage for receiving the (N−1)th gate signal, and a second end for receiving the first power voltage.

14. The shift register circuit of claim 12, wherein the second control unit further comprises:

a seventeenth transistor having a first end electrically connected to the second end of the thirteenth transistor, a gate end electrically connected to an (N−2)th shift register stage of the shift register stages for receiving an (N−2)th gate signal of the gate signals, and a second end for receiving the first power voltage; and an eighteenth transistor having a first end electrically connected to the gate end of the thirteenth transistor, a gate end electrically connected to the (N−2)th shift register stage for receiving the (N−2)th gate signal, and a second end for receiving the first power voltage.

15. The shift register circuit of claim 1, wherein:

the second auxiliary pull-down unit comprises:

a nineteenth transistor having a first end electrically connected to the input unit, a gate end for receiving the third control signal, and a second end for receiving the second power voltage; and a twentieth transistor having a first end electrically connected to the carry unit, a gate end for receiving the third control signal, and a second end for receiving the second power voltage; and the third control unit comprises:

a twenty-first transistor having a first end for receiving a first low-frequency clock, a gate end, and a second end for outputting the third control signal;

a twenty-second transistor having a first end electrically connected to the second end of the twenty-first transistor, a gate end for receiving the driving control voltage, and a second end for receiving the second power voltage;

a twenty-third transistor having a first end for receiving the first low-frequency clock, a gate end for receiving the first low-frequency clock, and a second end electrically connected to the gate end of the twenty-first transistor; and a twenty-fourth transistor having a first end electrically connected to the second end of the twenty-third transistor, a gate end for receiving the driving control voltage, and a second end for receiving the second power voltage.

16. The shift register circuit of claim 15, wherein the Nth shift register stage further comprises:

a third auxiliary pull-down unit, electrically connected to the carry unit and the input unit, for pulling down the driving control voltage and the Nth start pulse signal to the second power voltage according to a fourth control signal; and a fourth control unit, electrically connected to the third auxiliary pull-down unit and the input unit, for generating the fourth control signal according to the driving control voltage.

17. The shift register circuit of claim 16, wherein:

the third auxiliary pull-down unit comprises:

- a twenty-fifth transistor having a first end electrically connected to the input unit, a gate end for receiving the fourth control signal, and a second end for receiving the second power voltage; and
- a twenty-sixth transistor having a first end electrically connected to the carry unit, a gate end for receiving the fourth control signal, and a second end for receiving the second power voltage; and the fourth control unit comprises:

- a twenty-seventh transistor having a first end for receiving a second low-frequency clock having a phase opposite to the first low-frequency clock, a gate end, and a second end for outputting the fourth control signal;
- a twenty-eighth transistor having a first end electrically connected to the second end of the twenty-seventh transistor, a gate end for receiving the driving control voltage, and a second end for receiving the second power voltage;
- a twenty-ninth transistor having a first end for receiving the second low-frequency clock, a gate end for receiving the second low-frequency clock, and a second end electrically connected to the gate end of the twenty-seventh transistor; and
- a thirtieth transistor having a first end electrically connected to the second end of the twenty-ninth transistor, a gate end for receiving the driving control voltage, and a second end for receiving the second power voltage.

* * * * *